(12) United States Patent
Wong et al.

(10) Patent No.: US 9,929,713 B2
(45) Date of Patent: Mar. 27, 2018

(54) DUPLEXER AND COMMUNICATIONS SYSTEM HAVING DUPLEXER

(71) Applicant: Huawei Technologies Co., Ltd., Shenzhen (CN)

(72) Inventors: Sai-Wai Wong, Guangzhou (CN); Qingxin Chu, Guangzhou (CN); Yanzhao Zhou, Segrate (IT)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 34 days.

(21) Appl. No.: 15/183,300

(22) Filed: Jun. 15, 2016

(65) Prior Publication Data

US 2016/0301378 A1 Oct. 13, 2016

Related U.S. Application Data

(63) Continuation of application No. PCT/CN2014/093975, filed on Dec. 16, 2014.

(30) Foreign Application Priority Data

Dec. 16, 2013 (CN) .......................... 2013 1 0692452

(51) Int. Cl.
*H01P 5/12* (2006.01)
*H03H 7/46* (2006.01)
(Continued)

(52) U.S. Cl.
CPC ........... *H03H 7/465* (2013.01); *H01P 1/2084* (2013.01); *H01P 1/2138* (2013.01); *H01P 5/12* (2013.01); *H01P 7/105* (2013.01)

(58) Field of Classification Search
CPC ........ H01P 5/12; H01P 1/2084; H01P 1/2183; H01P 7/105; H05K 7/465
(Continued)

(56) References Cited

U.S. PATENT DOCUMENTS 3,696,314 A * 10/1972 Kell ...................... H01P 1/2084
333/205
3,840,828 A * 10/1974 Linn ................... H01P 1/20309
333/204
(Continued)

FOREIGN PATENT DOCUMENTS

CN 1717837 A 1/2006
CN 101630768 A 1/2010
(Continued)

OTHER PUBLICATIONS

Partial English Translation and Abstract of Chinese Patent Application No. CN102980510, Nov. 28, 2016, 13 pages.
(Continued)

*Primary Examiner* — Robert J Pascal
*Assistant Examiner* — Kimberly Glenn
(74) *Attorney, Agent, or Firm* — Conley Rose, P.C.

(57) ABSTRACT

The present disclosure is applicable to the field of communications device technologies is directed to a duplexer and a communications system having the duplexer. The duplexer includes a body, where an input port and an output port are disposed on the body, a cavity is disposed on the body, a dielectric resonator is disposed in the cavity, the input port is connected to an input-end coupling plate disposed opposite to the dielectric resonator, the output port is connected to an output-end coupling plate disposed opposite to the dielectric resonator, a tuning screw is connected to the body, and a central axis of the dielectric resonator misaligns with a central axis of the cavity. The communications system includes the duplexer.

19 Claims, 14 Drawing Sheets

(51) Int. Cl.
*H01P 1/208* (2006.01)
*H01P 1/213* (2006.01)
*H01P 7/10* (2006.01)

(58) Field of Classification Search
USPC .......................................................... 333/136
See application file for complete search history.

(56) References Cited

U.S. PATENT DOCUMENTS

| | | | |
|---|---|---|---|
| 4,675,630 | A | 6/1987 | Tang et al. |
| 4,902,991 | A | 2/1990 | Ishikawa et al. |
| 4,963,841 | A | 10/1990 | Sparagna |
| 5,498,771 | A | 3/1996 | Mansour et al. |
| 6,470,198 | B1 | 10/2002 | Kintaka et al. |
| 6,573,812 | B1 | 6/2003 | Wakamatsu et al. |
| 6,600,394 | B1 | 7/2003 | Wang et al. |
| 6,642,815 | B2 * | 11/2003 | Okazaki ............... H01P 1/2084 333/202 |
| 6,762,658 | B1 | 7/2004 | Isomura et al. |
| 9,472,835 | B2 * | 10/2016 | Zhou ...................... H01P 1/205 |
| 2006/0139127 | A1 | 6/2006 | Wada et al. |
| 2006/0185161 | A1 | 8/2006 | Rauscher |
| 2007/0152779 | A1 | 7/2007 | Ando et al. |
| 2008/0246561 | A1 | 10/2008 | Blair et al. |

FOREIGN PATENT DOCUMENTS

| | | |
|---|---|---|
| CN | 2014017813 Y | 3/2010 |
| CN | 102544649 A | 7/2012 |
| CN | 102544650 A | 7/2012 |
| CN | 202454695 U | 9/2012 |
| CN | 102800909 A | 11/2012 |
| CN | 102980510 A | 3/2013 |
| CN | 103296359 A | 9/2013 |
| CN | 103633402 A | 3/2014 |
| EP | 1220351 A2 | 7/2002 |
| EP | 1544963 A1 | 6/2005 |

OTHER PUBLICATIONS

Partial English Translation and Abstract of Chinese Patent Application No. CN103296359, Dec. 30, 2015, 4 pages.
Partial English Translation and Abstract of Chinese Patent Application No. CN201417813, Dec. 30, 2015, 3 pages.
Partial English Translation and Abstract of Chinese Patent Application No. CN101630768, Jun. 23, 2016, 5 pages.
Partial English Translation and Abstract of Chinese Patent Application No. CN103633402, Jun. 23, 2016, 4 pages.
Partial English Translation and Abstract of Chinese Patent Application No. CN102544650, Jun. 23, 2016, 3 pages.
Partial English Translation and Abstract of Chinese Patent Application No. CN102544649, Nov. 28, 2016, 8 pages.
Partial English Translation and Abstract of Chinese Patent Application No. CN102800909, Nov. 28, 2016, 13 pages.
Doust, D., et al., "Satellite Multiplexing Using Dielectric Resonator Filters," Microwave Journal, Horizon house Publications, vol. 32, No. 12, Dec. 1989, pp. 93-106.
Foreign Communication From A Counterpart Application, Chinese Application No. 201310692452.6, Chinese Office Action dated Mar. 6, 2015, 13 pages.
Foreign Communication From A Counterpart Application, Chinese Application No. 201310692452.6, Chinese Office Action dated Nov. 23, 2015, 10 pages.
Foreign Communication From A Counterpart Application, European Application No. 14872493.3, Extended European Search Report dated Nov. 15, 2016, 12 pages.
Foreign Communication From A Counterpart Application, PCT Application No. PCT/CN2014/093975, English Translation of International Search Report dated Apr. 1, 2015, 2 pages.
Foreign Communication From A Counterpart Application, PCT Application No. PCT/CN2014/093975, English Translation of Written Opinion dated Apr. 1, 2015, 9 pages.

* cited by examiner

DUPLEXER AND COMMUNICATIONS SYSTEM HAVING DUPLEXER

CROSS-REFERENCE TO RELATED APPLICATIONS

This application is a continuation of International Application No. PCT/CN2014/093975, filed on Dec. 16, 2014, which claims priority to Chinese Patent Application No. 201310692452.6, filed on Dec. 16, 2013, both of which are hereby incorporated by reference in their entireties.

TECHNICAL FIELD

The present disclosure pertains to the field of communications device technologies and relates to a duplexer and a communications system having the duplexer.

BACKGROUND

A dielectric filter is a filter including a dielectric resonator. The dielectric resonator is formed by repetitive total reflection and resonance of an electromagnetic wave inside a dielectric. In an actual application, a dual-mode filter may be equivalent to a dual-tunable resonant circuit. A band-pass filter may be fabricated using a coupling between two modes. In comparison with a conventional single-mode filter, the dual-mode filter has many advantages such as a low loss, a small volume, an elliptic function response, and a light weight.

In the prior art, generally, there are four methods for separating degenerate modes. (1) When a coupling screw is used to implement a coupling of degenerate modes to avoid interactions, the coupling screw should be located in a region that is near to a maximum value of electric field intensity of two resonators (which need to be coupled) and in which electric field intensity of other degenerate modes is zero. Generally, there is an angle of 45 degrees between the coupling screw and two polarized electric fields. However, a tunable range of this coupling manner is relatively narrow. (2) A coupling screw is inserted from a position that is an angle of 45 degrees above a dielectric resonator, and this may also separate degenerate modes. (3) A rectangular slot is cut, but processing in this coupling manner is difficult. (4) A slot is cut in a center of a dielectric resonator, but processing in this coupling manner is also difficult.

In the prior art, there is also a subminiature band-pass filter applied to a Universal Mobile Telecommunications System (UMTS) base station. The subminiature band-pass filter includes the following several parts: two triple-mode electroplated ceramic resonators and one metallic coaxial comb resonator that is located between the two triple-mode ceramic resonators. A multi-mode principle of the subminiature band-pass filter uses the foregoing method (1) and method (3). The two resonators constitute a composite structure, which is used to solve a common problem that a parasitic characteristic of an insulated ceramic multi-mode filter is generally poor. Out-of-band suppression of the subminiature band-pass filter can achieve the following good characteristics: more than 70 decibels (dBs) if a frequency is lower than 1880 MHz and more than 95 dB if a frequency is higher than 2110 megahertz (MHz). In addition, an in-band insertion loss of the subminiature band-pass filter is less than 1 dB, and a return loss is less than −20 dBs. Resonant frequencies of three orthogonal modes of each triple-mode resonant cavity are respectively decided by a size of each side of an electroplated ceramic block. Each corner decides a coupling coefficient between two orthogonal modes. Stimulation of each triple-mode ceramic block is implemented using a probe. A size of a hole through the probe is inserted into a ceramic block decides a coupling between an input and an output. A coupling between the third mode of each triple-mode resonant cavity and a central coaxial resonator is implemented using a hole of a specific size. In subminiature band-pass filter, there is one tuning screw on ceramic blocks of three modes respectively. A response curve of the filter in an actual test is quite consistent with a response curve of a simulated filter. However, in the prior art, a shape of a ceramic body in the filter is complex, processing is difficult, and mass production is not easy. A precision of corner cutting on the ceramic body cannot be ensured, and production costs are high.

TECHNICAL PROBLEM

An objective of the present disclosure is to overcome the foregoing disadvantages of the prior art and provide a duplexer and a communications system having the duplexer, where the duplexer facilitates processing, and production costs are low.

TECHNICAL SOLUTION

According to a first aspect, in a first implementation solution, the present disclosure provides a duplexer, including a body, where an input port and an output port are disposed on the body, a cavity is disposed on the body, a dielectric resonator is disposed in the cavity, the input port is connected to an input-end coupling plate disposed opposite to the dielectric resonator, the output port is connected to an output-end coupling plate disposed opposite to the dielectric resonator, a tuning screw is connected to the body, and a central axis of the dielectric resonator misaligns with a central axis of the cavity.

With reference to the first implementation solution, in a second implementation solution, the dielectric resonator is disposed and shifted toward a position of the input port and/or the output port relative to the central axis of the cavity.

With reference to the first implementation solution or the second implementation solution, in a third implementation solution, a dielectric tuner is further disposed in the cavity, and the dielectric tuner is located over the dielectric resonator, and is connected to the body using a first connecting member.

With reference to the third implementation solution, in a fourth implementation solution, a central axis of the dielectric tuner coincides with the central axis of the dielectric resonator.

With reference to the first implementation solution, in a fifth implementation solution, a supporting dielectric is further disposed in the cavity, and the supporting dielectric is located under the dielectric resonator, and is connected to the body using a second connecting member.

With reference to the fifth implementation solution, in a sixth implementation solution, a central axis of the supporting dielectric coincides with the central axis of the dielectric resonator.

With reference to any one of the first to sixth implementation solutions, in a seventh implementation solution, the input port includes an input-end interior conductor and an input-end exterior conductor, where the input-end interior conductor is covered by the input-end exterior conductor with a spacing, the output port includes an output-end interior conductor and an output-end exterior conductor, where the output-end interior conductor is covered by the output-end exterior conductor with a spacing, and the input-end coupling plate is connected to the input-end interior conductor, and the output-end coupling plate is connected to the output-end interior conductor.

With reference to the seventh implementation solution, in an eighth implementation solution, the input-end exterior conductor and the output-end exterior conductor are both formed on the body in an integrated manner.

With reference to any one of the first to sixth implementation solutions, in a ninth implementation solution, a cross-section of the cavity takes on a circular or rectangular shape, and a cross-section of the dielectric resonator takes on a circular or rectangular shape.

With reference to any one of the first to sixth implementation solutions, in a tenth implementation solution, the body includes a first body and a second body, where the first body and the second body are butted and disposed up and down, an upper half cavity is disposed at a lower end of the first body, and a lower half cavity is disposed at an upper end of the second body, and a slot for placing a connecting bar is disposed on a lower end face of the first body and an upper end face of the second body each.

With reference to the tenth implementation solution, in an eleventh implementation solution, pin holes are disposed on the first body and an end face opposite to the first body, and positioning pins are inserted in the pin holes, and the first body and the second body are fixedly connected using a locking member.

With reference to any one of the first to sixth implementation solutions, in a twelfth implementation solution, at least two cavities are disposed, and the dielectric resonator is disposed in each cavity, where the input port is connected to at least one cavity, the output port is disposed on at least another cavity, the cavities are connected using a coaxial connecting bar, end parts that are of the coaxial connecting bar and that stretch into the cavities are each connected to a coupling plate opposite to the dielectric resonator, and the coaxial connecting bar includes an input end and an output end that are connected to the cavities, and further includes a short-circuited end and/or a connecting port.

With reference to the twelfth implementation solution, in a thirteenth implementation solution, the coaxial connecting bar is a T-shaped coaxial connecting bar and/or a cross-shaped coaxial connecting bar.

With reference to the thirteenth implementation solution, in a fourteenth implementation solution, two adjacent cavities are connected in series using two cross-shaped coaxial connecting bars, or connected in series using two T-shaped coaxial connecting bars, or connected in series using one T-shaped coaxial connecting bar and one cross-shaped coaxial connecting bar.

With reference to any one of the first to sixth implementation solutions, in a fifteenth implementation solution, two cavities are disposed, and are respectively a first cavity and a second cavity that are disposed adjacently, two dielectric resonators are disposed, and are respectively a first dielectric resonator and a second dielectric resonator, the first dielectric resonator is disposed in the first cavity, and the second dielectric resonator is disposed in the second cavity, the input port is connected to the first cavity, and the output port is connected to the second cavity, and the first cavity and the second cavity are connected using a coaxial connecting bar, where two ends of the coaxial connecting bar are respectively connected to a coupling plate opposite to the first dielectric resonator and a coupling plate opposite to the second dielectric resonator.

With reference to the fifteenth implementation solution, in a sixteenth implementation solution, the input port on the first cavity and the output port on the second cavity are both perpendicular to a connecting line that connects a central axis of the first cavity and a central axis of the second cavity, and the input port on the first cavity and the output port on the second cavity are disposed in opposite directions, the first dielectric resonator in the first cavity is shifted in a direction of the input port and the coaxial connecting bar to misalign with the central axis of the first cavity, and the second dielectric resonator in the second cavity is shifted in a direction of the output port and the coaxial connecting bar to misalign with the central axis of the second cavity.

With reference to the sixteenth implementation solution, in a seventeenth implementation solution, the coaxial connecting bar is a T-shaped coaxial connecting bar, where the T-shaped coaxial connecting bar includes a short-circuited end, an input end connected to the first cavity, and an output end connected to the second cavity, and the input end and the output end are disposed in opposite directions, or the coaxial connecting bar is a cross-shaped coaxial connecting bar, where the cross-shaped coaxial connecting bar includes a short-circuited end, a connecting end, an input end connected to the first cavity, and an output end connected to the second cavity, and the input end and the output end are disposed in opposite directions.

With reference to any one of the first to sixth implementation solutions, in an eighteenth implementation solution, four cavities are disposed, and are respectively a first cavity, a second cavity, a third cavity, and a fourth cavity that are disposed in two rows and two columns, four dielectric resonators are disposed, and are respectively a first dielectric resonator, a second dielectric resonator, a third dielectric resonator, and a fourth dielectric resonator, the first dielectric resonator is disposed in the first cavity, the second dielectric resonator is disposed in the second cavity, the third dielectric resonator is disposed in the third cavity, and the fourth dielectric resonator is disposed in the fourth cavity, the input port is connected to the first cavity, and the output port is connected to the fourth cavity, and the first cavity and the second cavity are connected using a first T-shaped coaxial connecting bar, the third cavity and the fourth cavity are connected using a second T-shaped coaxial connecting bar, and the first cavity and the third cavity are connected using a cross-shaped coaxial connecting bar, or the second cavity and the fourth cavity are connected using a cross-shaped coaxial connecting bar.

According to a second aspect, the present disclosure further provides a communications system, where the communications system includes the duplexer according to any one of the implementation solutions in the first aspect.

In the duplexer and the communications system having the duplexer that are provided by the present disclosure, the duplexer, by shifting a dielectric resonator, effectively implements separation of degenerate modes (HE modes) in a case of low design and low processing difficulty, and does not need to use a structure with a slotted dielectric resonator or a slotted metal cavity. This reduces difficulty in processing the dielectric resonator and the body, avoids a problem that it is difficult to form and manufacture an irregular ceramic body, and facilitates processing, and production costs are low.

DESCRIPTION OF EMBODIMENTS

To make the objectives, technical solutions, and advantages of the present disclosure clearer and more comprehensible, the following further describes the present disclosure in detail with reference to the accompanying drawings and embodiments. It should be understood that the specific embodiments described herein are merely used to explain the present disclosure but are not intended to limit the present disclosure.

It should be noted that, when an element is described that it is "fixed" or "disposed" on another element, the element may be directly located on the another element, or there may be an intermediate element. When an element is "connected" to another element, the element may be directly connected to the other element, or there may be an intermediate element.

It should also be noted that, terms of orientation in the embodiments, such as left, right, up, and down, are merely mutually relative concepts or make reference to a normal use status of a product, and should not be considered as limitations.

Figure 1:
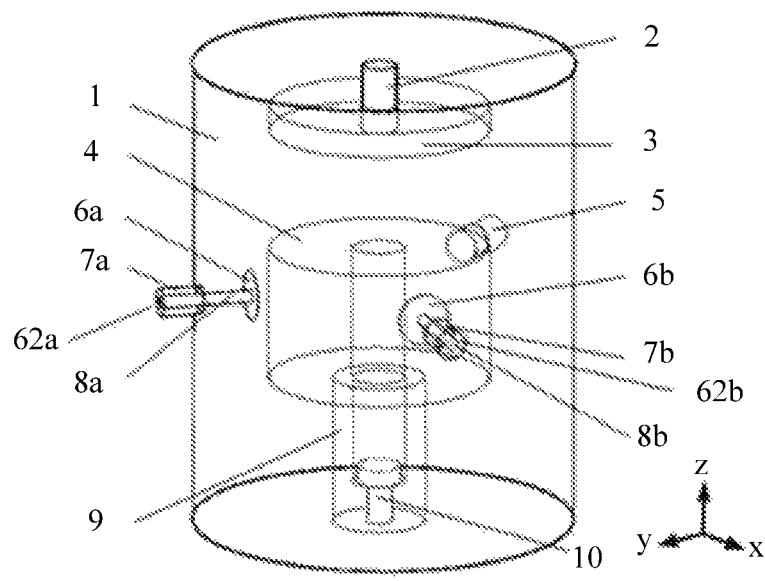
FIG. 1 is a schematic structural diagram of a duplexer according to Embodiment 1 of the present disclosure.
Figure 2:
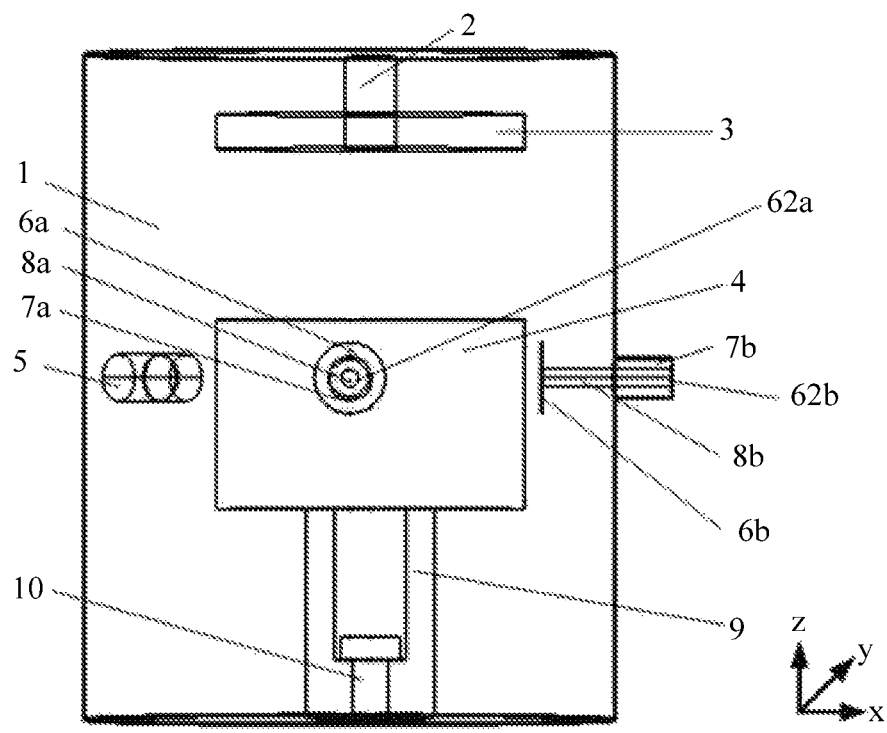
FIG. 2 is a side view of a duplexer according to Embodiment 1 of the present disclosure.

As shown in FIG. 1 and FIG. 2, an embodiment of the present disclosure provides a duplexer, which may also be used as a multi-mode filter. The duplexer includes a body, where an input port 62a and an output port 62b are disposed on the body, a cavity 1 is disposed on the body, a dielectric resonator 4 is disposed in the cavity 1, the input port 62a is connected to an input-end coupling plate 6a disposed opposite to the dielectric resonator 4, the output port 62b is connected to an output-end coupling plate disposed opposite to the dielectric resonator 4, a tuning screw 5 is connected to the body, the tuning screw 5 may be connected to the body using threads and stretch into the cavity 1, and one end that is of the tuning screw 5 and that stretches into the cavity 1 is disposed opposite to the tuning screw 5. A direction of disposition of the tuning screw 5 may point to a central axis of the cavity 1, an included angle between the tuning screw 5 and the input port 62a is equal to an included angle between the tuning screw 5 and the output port 62b, and the tuning screw 5 is located in a direction away from the input port 62a and/or output port 62b. A central axis of the dielectric resonator 4 misaligns with the central axis of the cavity 1. By shifting the dielectric resonator 4, after the dielectric resonator 4 is shifted relative to the central axis of the cavity, resonant frequencies of three modes generated in the same cavity may change. Because there is a coupling matrix in filter (duplexer) design, to meet a specific coupling bandwidth, different frequencies may be used. A shifting technology implements a passband characteristic of the filter, meets a bandwidth requirement, may implement changes of resonant frequencies of different modes and effectively implement separation of degenerate modes (HE modes) in a case of low design and low processing difficulty, and does not need to use a structure with a slotted dielectric resonator or a slotted metal cavity. This reduces difficulty in processing the dielectric resonator and the body, avoids a problem that it is difficult to form and manufacture an irregular ceramic body, and can meet characteristics such as miniaturization, high selectivity, a large Q value, and simple design and processing. The duplexer provided in this embodiment of the present disclosure has a simple contour and structure, which facilitates processing and mass production. The Q value refers to a quality factor of the filter or duplexer. The Q value is a ratio of stored energy to consumed energy. Larger energy storage space results in a larger Q value of the filter or duplexer.

Figure 3:
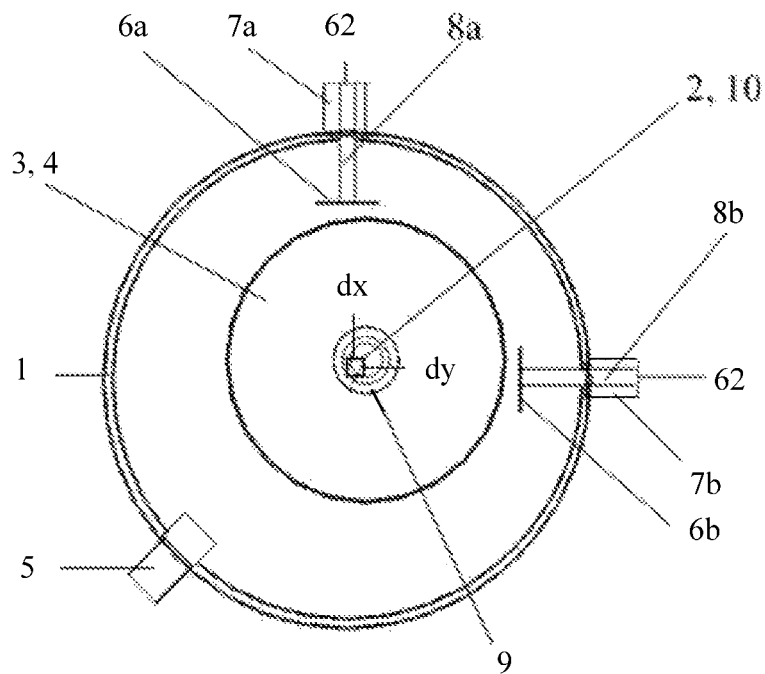
FIG. 3 is a top view of a duplexer according to Embodiment 1 of the present disclosure.
Figure 4:
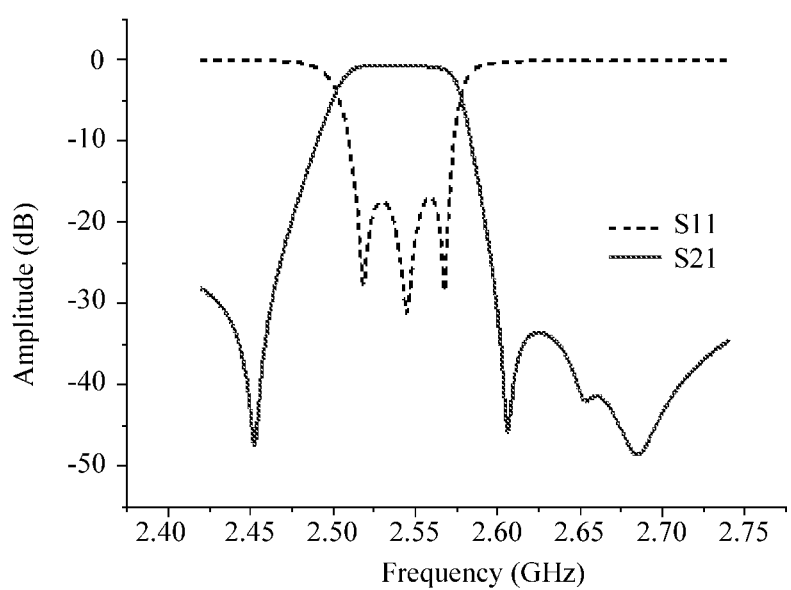
FIG. 4 is an electromagnetic simulation curve diagram of a frequency response of a duplexer according to Embodiment 1 of the present disclosure.

In this embodiment, as shown in FIG. 3 and FIG. 4, a coordinate system is established using a center of the cavity 1 as an origin, a vertical direction as an x direction, and a horizontal direction as a y direction. The input port 62a faces a positive x direction, and the output port 62b faces a positive y direction. The dielectric resonator 4 is shifted by dx in the positive x direction, and shifted by dy in the positive y direction, where dx and dy may be equal, or may be unequal. An included angle between the input port 62a (positive x direction) and the output port 62b (positive y direction) is 90 degrees. The included angle between the tuning screw 5 and the input port 62a (positive x direction) and the included angle between the tuning screw 5 and the output port 62b (positive y direction) are both 135 degrees.

The dielectric resonator 4 may be disposed and shifted in the direction of the input port 62a and/or the output port 62b relative to the central axis of the cavity 1. The input port 62a and the output port 62b are both connected to a same cavity 1, and the dielectric resonator may be shifted in both directions of the output port 62b and the input port 62a. When the duplexer has two or more cavities 1, and only the input port 62a or the output port 62b is connected to a same cavity 1, the dielectric resonator 4 may be shifted in the direction of the input port 62a or the output port 62b, and may be further shifted in a direction near to an adjacent cavity 1 or away from an adjacent cavity 1. A specific shifting direction and distance of may be set according to an actual situation.

As shown in FIG. 1 and FIG. 2, a dielectric tuner 3 is further disposed in the cavity 1, and the dielectric tuner 3 may take on a disc shape, and the shape may be the same as a shape of a cross-section of the cavity 1. The dielectric tuner 3 is located over the dielectric resonator 4 and is connected to the body using a first connecting member 2. The first connecting member 2 may be a screw. The first connecting member 2 is connected to the body from the top of the body using threads, and locks the dielectric tuner 3.

As shown in FIG. 1 and FIG. 2, a central axis of the dielectric tuner 3 coincides with the central axis of the dielectric resonator 4 to ensure performance of the duplexer.

As shown in FIG. 1 and FIG. 2, a supporting dielectric 9 is further disposed in the cavity 1, and the supporting dielectric 9 is located under the dielectric resonator 4 and is connected to the body using a second connecting member 10. The second connecting member 10 may be a screw. The second connecting member 10 is connected to the body from the bottom of the body using threads, and locks the supporting dielectric 9.

As shown in FIG. 1 and FIG. 2, a central axis of the supporting dielectric 9 coincides with the central axis of the dielectric resonator 4 to ensure the performance of the duplexer.

As shown in FIG. 1 and FIG. 2, the input port 62a includes an input-end interior conductor 8a and an input-end exterior conductor 7a, where the input-end interior conductor 8a is covered by the input-end exterior conductor 7a with a spacing, and the input-end interior conductor 8a and the input-end exterior conductor 7a are disposed along a same axis. The output port 62b includes an output-end interior conductor 8b and an output-end exterior conductor 7b, where the output-end interior conductor 8b is covered by the output-end exterior conductor 7b with a spacing, and the output-end interior conductor 8b and the output-end exterior conductor 7b are disposed along a same axis. The input-end coupling plate 6a is connected to the input-end interior conductor 8a, and the output-end coupling plate is connected to the output-end interior conductor 8b. The input-end coupling plate 6a and the output-end coupling plate 6b may take on a circular shape. A circular coupling plate is welded on an interior conductor connected to a SubMiniature version A (SMA) connector, to implement a coupling between a feeder and a dielectric resonator such that a distance between a coaxial interior conductor connected to the SMA connector and the dielectric resonator does not need to be excessively short.

As shown in FIG. 1 and FIG. 2, the input-end exterior conductor 7a and the output-end exterior conductor 7b are both formed on the body in an integrated manner, that is, through-holes penetrating the cavity 1 are opened on a side wall of the body, and the through-holes may be used to place the input port 62a and the output port 62b. The processing is quite convenient. Because integrated processing is used for processing the body, the input-end exterior conductor 7a, and the output-end exterior conductor 7b, a problem of complex processing thereof is solved, and processing costs are reduced The input-end interior conductor 8a and the output-end interior conductor 8b are used to connect to SMA connectors.

Figure 20A:
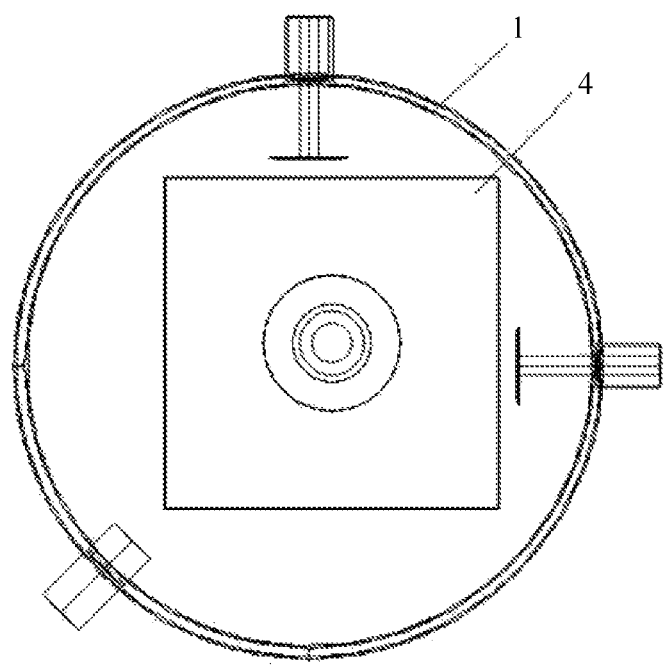
FIG. 20A is a top view of a duplexer whose cavity takes on a circular shape and dielectric resonator takes on a rectangular shape according to Embodiment 1 of the present disclosure.
Figure 20B:
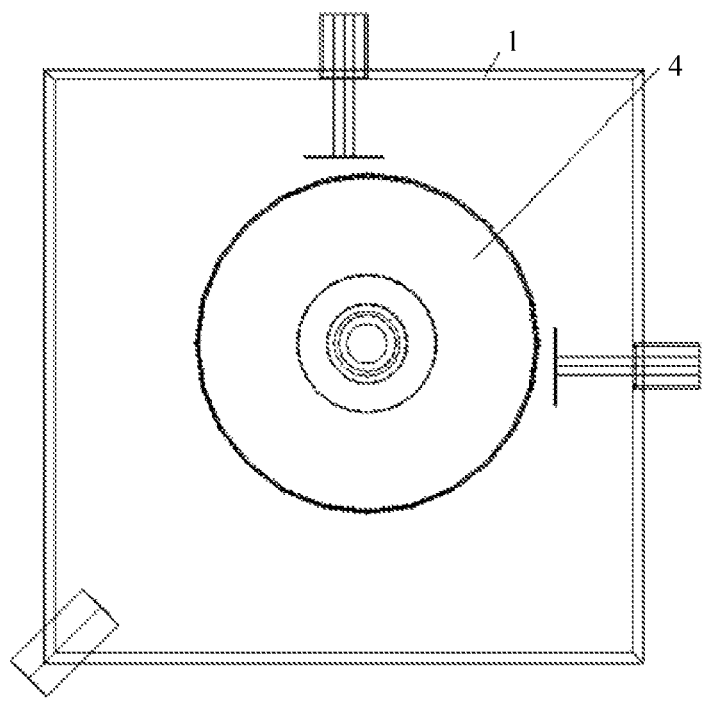
FIG. 20B is a top view of a duplexer whose cavity takes on a rectangular shape and dielectric resonator takes on a circular shape according to Embodiment 1 of the present disclosure.
Figure 20C:
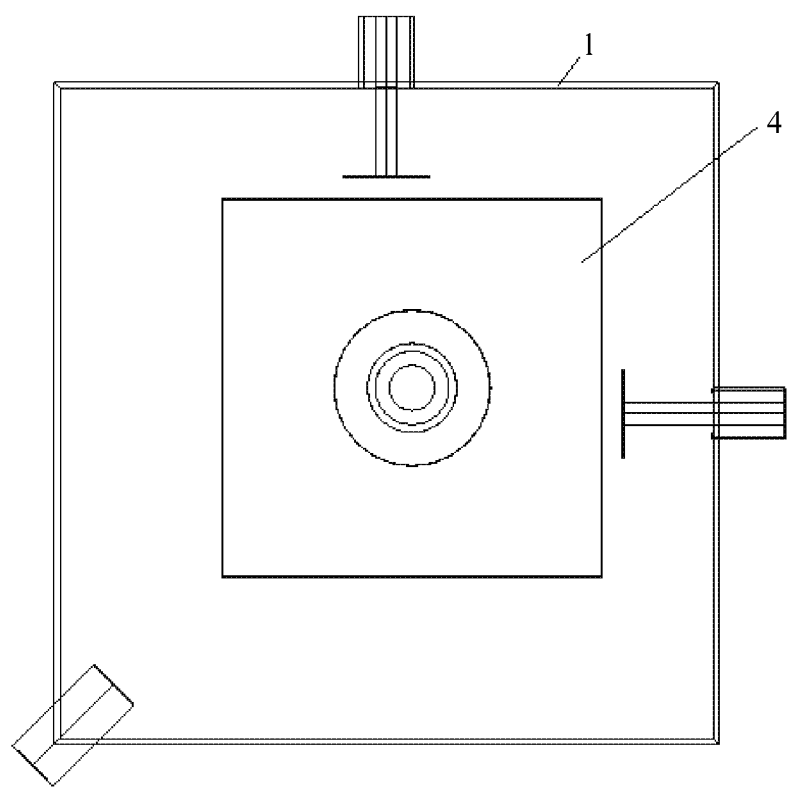
FIG. 20C is a top view of a duplexer whose cavity takes on a rectangular shape and dielectric resonator takes on a rectangular shape according to Embodiment 1 of the present disclosure.

As shown in FIG. 20A, FIG. 20B, and FIG. 20C, the cross-section of the cavity 1 may take on an appropriate shape such as a circle or a rectangle, and a cross-section of the dielectric resonator 4 may take on an appropriate shape such as a circle or a rectangle.

Figure 5:
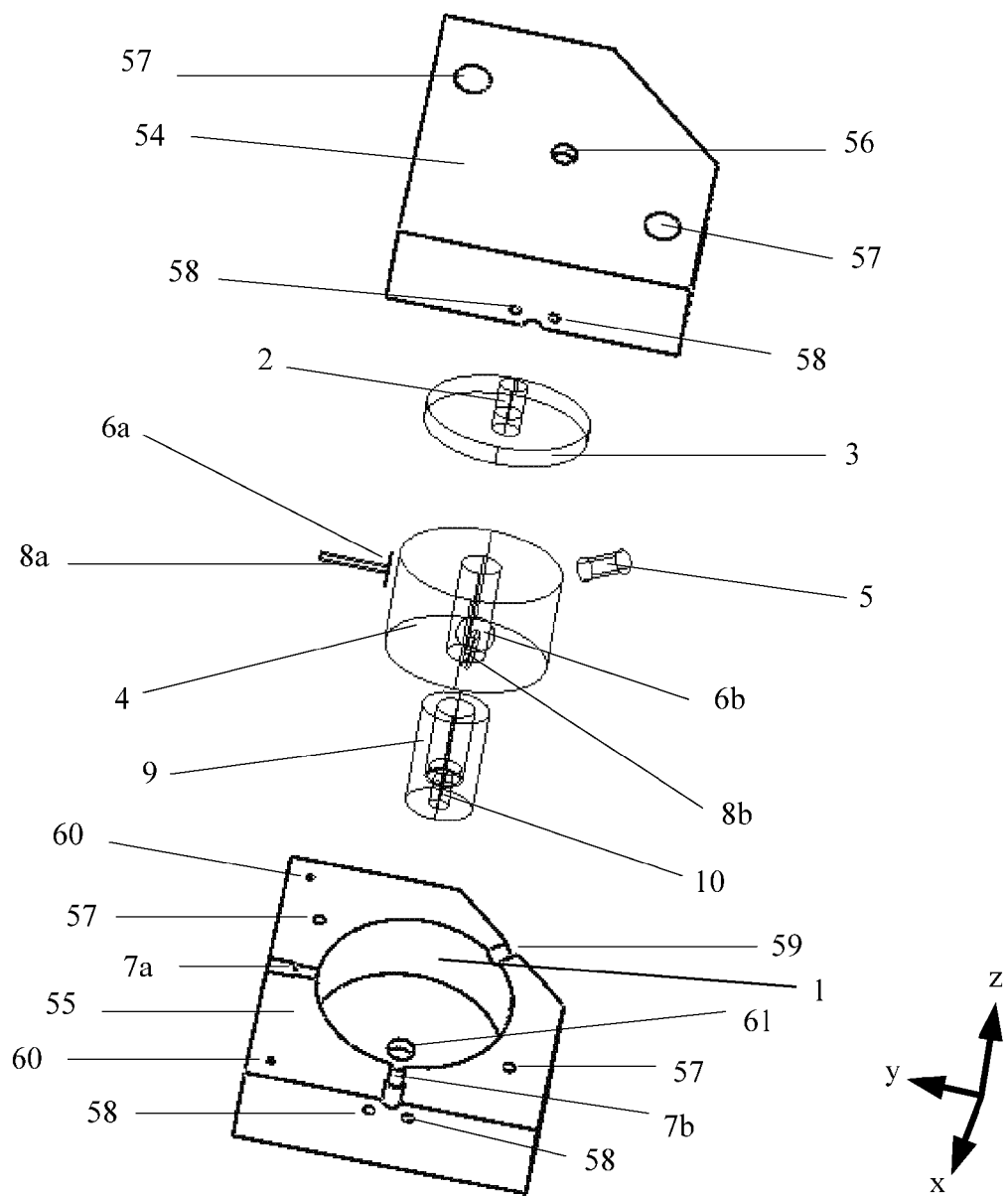
FIG. 5 is a schematic structural diagram of implementing a duplexer according to Embodiment 1 of the present disclosure.

As shown in FIG. 5, the body includes a first body 54 and a second body 55, where the first body 54 and the second body 55 may be butted and disposed up and down, an upper half cavity is disposed at a lower end of the first body 54, and a lower half cavity is disposed at an upper end of the second body 55, and the upper half cavity and the lower half cavity are butted to form the cavity 1.

As shown in FIG. 5, pin holes 60 are disposed on the first body 54 and an end face opposite to the first body 54, and positioning pins are inserted in the pin holes 60, for precise positioning of the first body 54 and the second body 55. This is advantageous for ensuring the performance of the duplexer. The first body 54 and the second body 55 are fixedly connected using a locking member. The locking member may be a screw or the like, and assembly thereof is simple and convenient. Mounting holes 57 that match the locking member are disposed on the first body 54 and the second body 55. A threaded hole 56 that matches the first connecting member 2 is disposed on the top of the first body 54, and a threaded hole 61 that matches the second connecting member 10 is disposed at the bottom of the second body 55. Threaded holes 58 for fixing SMA connectors are disposed at positions that are on side faces of the first body 54 and the second body 55 and that are corresponding to the input port 62a and the output port 62b. Threaded holes 59 that match the tuning screws 5 are disposed on the end face of the first body 54 and an end face of the second body 55 that are opposite to each other.

In a specific application, a contour of the body may take on a rectangular shape, the tuning screw 5 connected to the body is located in a corner of the body, and the corner that is of the body and that is connected to the tuning screw is cut.

The duplexer provided in this embodiment of the present disclosure overcomes a problem that it is difficult to generate zeros in existing single-cavity and single-mode duplexer, and a highly-selective dielectric multi-mode filter and duplexer having transmission zeros on both sides of a passband are provided.

This embodiment of the present disclosure further provides a communications system. The communications system includes the duplexer.

Embodiment 2

This embodiment is different from Embodiment 1 in which there may be only one cavity in a duplexer. In this embodiment, at least two cavities are disposed, and a dielectric resonator is disposed in each cavity, where an input port is connected to at least one cavity, an output port is disposed on at least another cavity, the cavities are connected using a coaxial connecting bar, and the coaxial connecting bar may be used to match a multi-mode resonant cavity.

Figure 6:
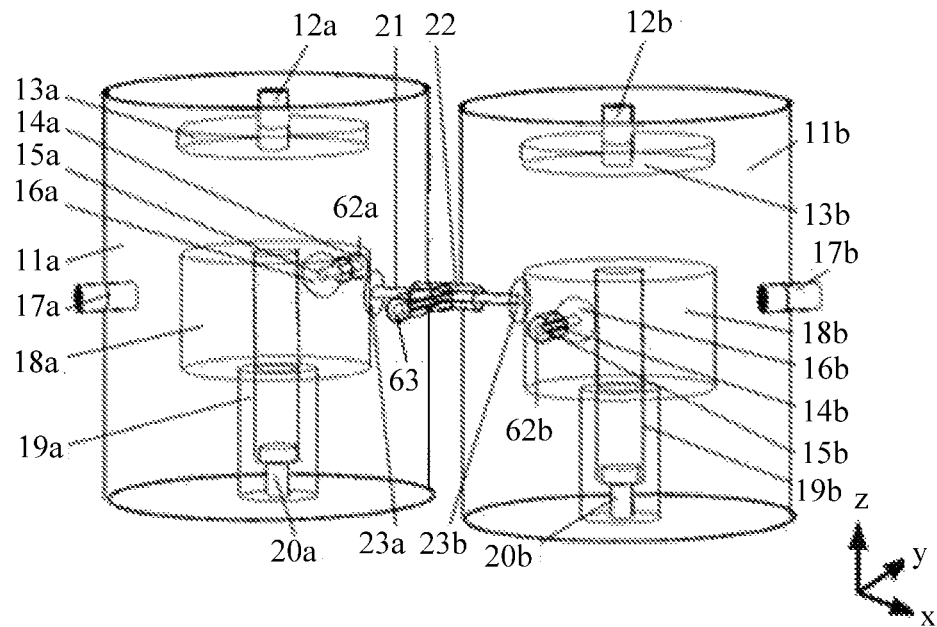
FIG. 6 is a schematic structural diagram of a duplexer according to Embodiment 2 of the present disclosure.
Figure 7:
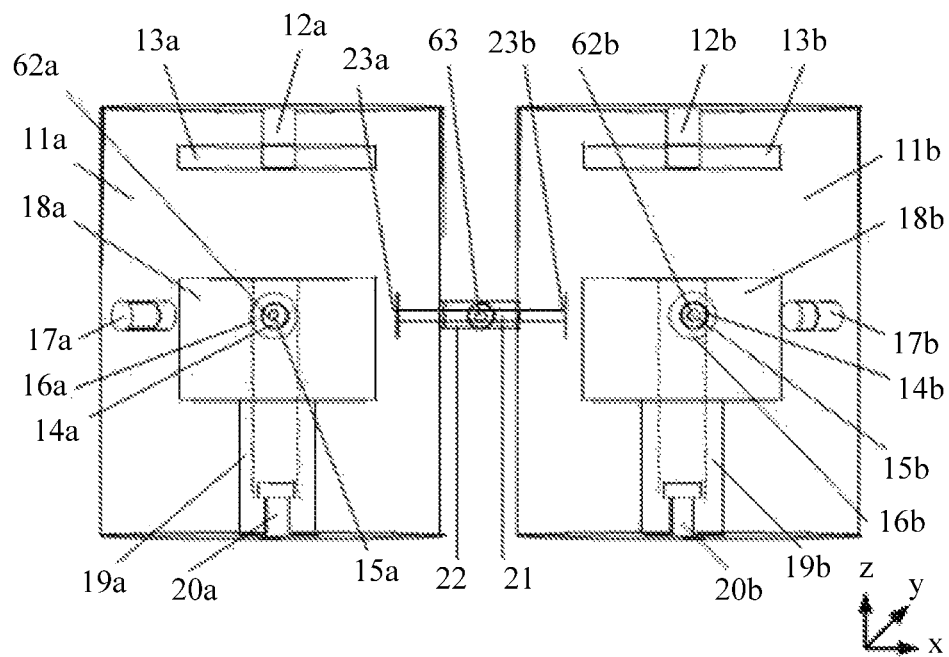
FIG. 7 is a side view of a duplexer according to Embodiment 2 of the present disclosure.

As shown in FIG. 6 and FIG. 7, in an example of this embodiment, two cavities are disposed. The two cavities are respectively a first cavity 11a and a second cavity 11b that are disposed adjacently, and the first cavity 11a and the second cavity 11b may be located on a same body. Two dielectric resonators are disposed, and are respectively a first dielectric resonator 18a and a second dielectric resonator 18b, where the first dielectric resonator 18a is disposed in the first cavity 11a, and the second dielectric resonator 18b is disposed in the second cavity 11b. An input port is connected to the first cavity 11a, and an output port is connected to the second cavity 11b, and the first cavity 11a and the second cavity 11b are connected using a coaxial connecting bar. The coaxial connecting bar includes a coaxial connecting bar interior conductor 21 and a coaxial connecting bar exterior conductor 22. The coaxial connecting bar interior conductor 21 is connected to an input-end interior conductor 15a of the input port and an output-end interior conductor 15b of the output port. The coaxial connecting bar exterior conductor 22 is connected to an input-end exterior conductor 14a of the input port and an output-end exterior conductor 14b of the output port. Two ends of the coaxial connecting bar are respectively connected to a coupling plate 23a opposite to the first dielectric resonator 18a and a coupling plate 23b opposite to the second dielectric resonator 18b. The coupling plates 23a and 23b may take on a circular shape.

As shown in FIG. 6 and FIG. 7, a first dielectric tuner 13a and a first supporting dielectric 19a are disposed in the first cavity 11a, the first dielectric tuner 13a is connected to the body using a screw 12a, and the first supporting dielectric 19a is connected to the body using a screw 20a. A second dielectric tuner 13b and a second supporting dielectric 19b are disposed in the second cavity 11b, the second dielectric tuner 13b is connected to the body using a screw 12b, and the second supporting dielectric 19b is connected to the body using a screw 20b.

As shown in FIG. 6 and FIG. 7, the input-end interior conductor 15a, the input-end exterior conductor 14a, and a first tuning screw 17a are connected to the first cavity 11a. The output-end interior conductor 15b, the output-end exterior conductor 14b, and a first tuning screw 17b are connected to the second cavity 11b. An input-end coupling plate 16a and an output-end coupling plate 16b are respectively connected to the input-end interior conductor 15a and the output-end interior conductor 15b.

As shown in FIG. 6 and FIG. 7, the coaxial connecting bar may be a T-shaped coaxial connecting bar and/or a cross-shaped coaxial connecting bar or the like. The coaxial connecting bar includes an input end that is connected to the first cavity 11a and an output end that is connected to the second cavity 11b, and further includes a short-circuited end 63 and/or a connecting port.

In a specific application, as shown in FIG. 6 and FIG. 7, two adjacent cavities may be connected in series using two cross-shaped coaxial connecting bars, or connected in series using two T-shaped coaxial connecting bars, or connected in series using one T-shaped coaxial connecting bar and one cross-shaped coaxial connecting bar. A slot for placing the coaxial connecting bar is disposed on a lower end face of a first body 54 and an upper end face of a second body 55 each.

Figure 8:
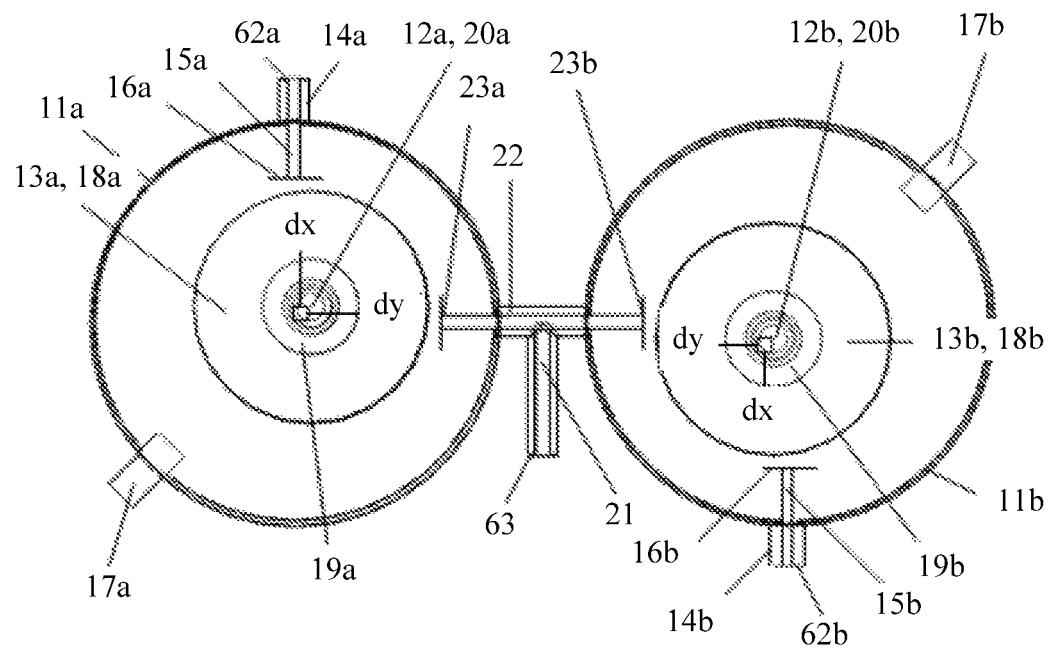
FIG. 8 is a top view of a duplexer according to Embodiment 2 of the present disclosure.
Figure 9:
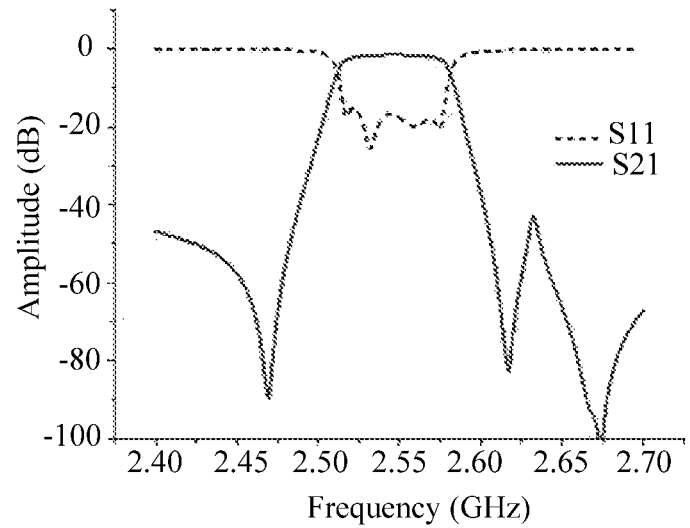
FIG. 9 is an electromagnetic simulation curve diagram of a filter frequency response of a duplexer according to Embodiment 2 of the present disclosure.

As shown in FIG. 7 to FIG. 9, the input port on the first cavity 11a and the output port on the second cavity 11b are both perpendicular to a connecting line that connects a central axis of the first cavity 11a and a central axis of the second cavity 11b, and the input port on the first cavity 11a and the output port on the second cavity 11b are disposed in opposite directions. The first dielectric resonator 18a in the first cavity 11a is shifted in a direction of the input port and the coaxial connecting bar to misalign with the central axis of the first cavity 11a, and the second dielectric resonator 18b in the second cavity 11b is shifted in a direction of the output port and the coaxial connecting bar to misalign with the central axis of the second cavity 11b. A first tuning screw 5 is connected to the first cavity 11a, and a second tuning screw 5 is connected to the second cavity 11b. The first tuning screw 5 and the second tuning screw 5 are disposed in opposite directions. The first tuning screw 5 points to the central axis of the first cavity 11a, and an included angle between the first tuning screw 5 and the input port is equal to an included angle between the first tuning screw 5 and the connecting line of the two cavities 1. The second tuning screw 5 points to the central axis of the second cavity 11b, and an included angle between the second tuning screw 5 and the output port is equal to an included angle between the second tuning screw 5 and the connecting line of the two cavities 1.

In this embodiment, the coaxial connecting bar is a T-shaped coaxial connecting bar, where the T-shaped coaxial connecting bar includes a short-circuited end 63, an input end connected to the first cavity 11a, and an output end connected to the second cavity 11b, and the input end and the output end are disposed in opposite directions.

Figure 10:
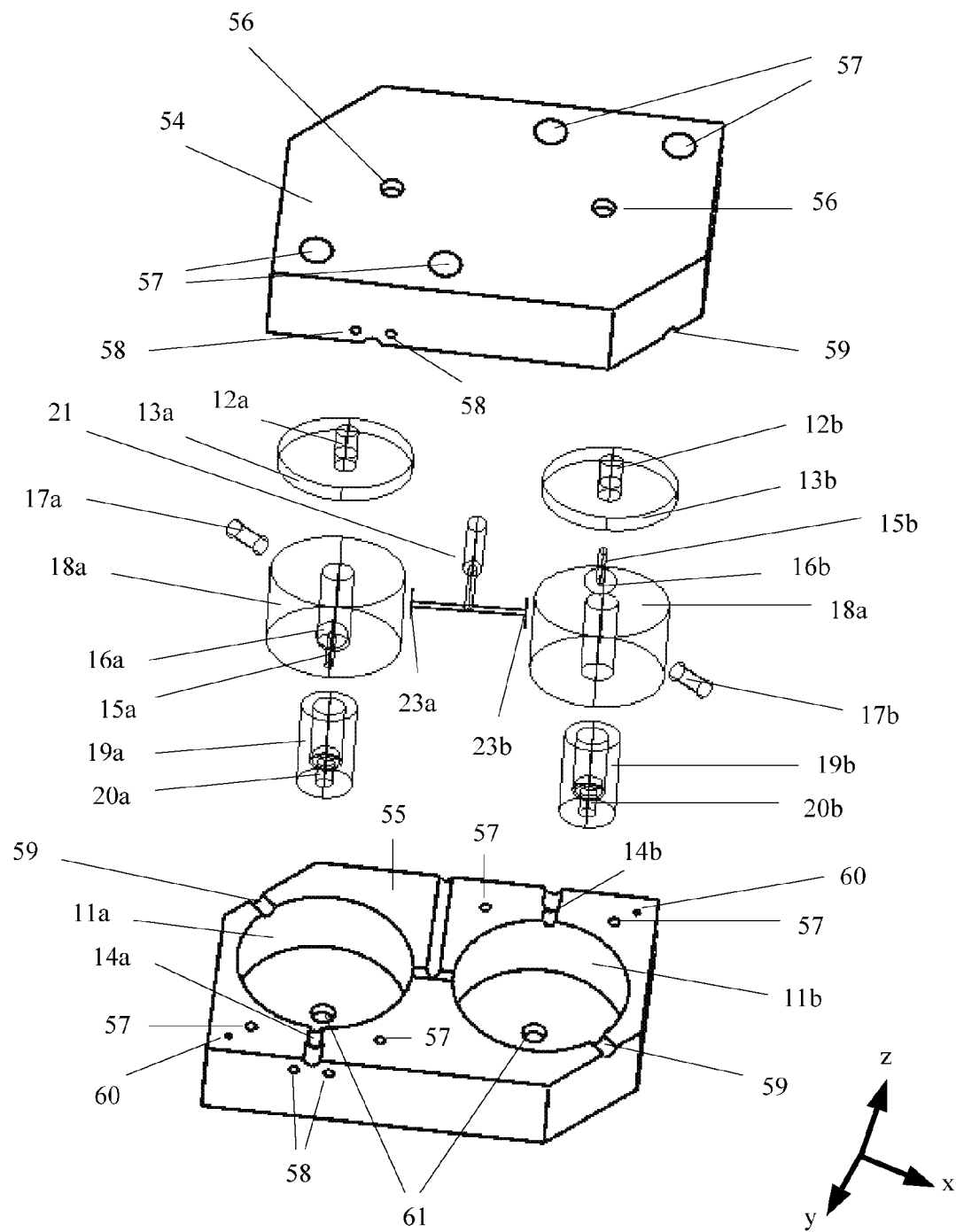
FIG. 10 is a schematic structural diagram of implementing a duplexer according to Embodiment 2 of the present disclosure.

As shown in FIG. 6 and FIG. 10, the body includes a first body 54 and a second body 55, where the first body 54 and the second body 55 may be butted and disposed up and down, an upper half cavity is disposed at a lower end of the first body 54, and a lower half cavity is disposed at an upper end of the second body 55, and the upper half cavity and the lower half cavity are butted to form the cavity 1.

In one embodiment, pin holes 60 are disposed on the first body 54 and an end face opposite to the first body 54, and positioning pins are inserted in the pin holes 60, for precise positioning of the first body 54 and the second body 55. This is advantageous for ensuring performance of the duplexer. The first body 54 and the second body 55 are fixedly connected using a locking member. The locking member may be a screw or the like, and assembly thereof is simple and convenient. Mounting holes 57 that match the locking member are disposed on the first body 54 and the second body 55. Threaded holes 56 that match the screws 12a and 12b are disposed on the top of the first body 54, and threaded holes 61 that match the screws 20a and 20b are disposed at the bottom of the second body 55. Threaded holes 58 for fixing SMA connectors are disposed at positions that are on side faces of the first body 54 and the second body 55 and that are corresponding to the input port and the output port 62. Threaded holes 59 that match the tuning screws 17a and 17b are disposed on the end face of the first body 54 and an end face of the second body 55 that are opposite to each other.

In this embodiment, as shown in FIG. 6 to FIG. 9, a coordinate system is established using a center of the first cavity 11a or a center of the second cavity 11b as an origin, a vertical direction as an x direction, and a horizontal direction as a y direction. The input port faces a positive x direction, and the output port faces a negative x direction. The first dielectric resonator 18a is shifted by dx in the positive x direction, and shifted by dy in a positive y direction, where dx and dy may be equal, or may be unequal. The second dielectric resonator 18*b* is shifted by dx in the negative x direction, and shifted by dy in a negative y direction, where dx and dy may be equal, or may be unequal. An included angle between the input port (positive x direction) and the output port (negative x direction) is 180 degrees. An included angle between the tuning screw 5 and the input port (positive x direction) and an included angle between the tuning screw 5 and the output port (negative x direction) are both 135 degrees.

The duplexer provided in this embodiment of the present disclosure overcomes a problem that it is difficult to generate zeros in existing single-cavity and single-mode duplexer, and a highly-selective dielectric multi-mode filter and duplexer having transmission zeros on both sides of a passband are provided.

The duplexer in this embodiment is a double-cavity multi-mode dielectric filter, and is used to improve passband selectivity and improve stopband suppression such that filter performance is improved. On a basis of a single-cavity multi-mode dielectric filter, a T-shaped coaxial connecting bar is added, where two ends of the T-shaped coaxial connecting bar are used to connect to two cavities (a first cavity 11*a* and a second cavity 11*b*), and the other end is a coaxial short stub (a short-circuited end 63, also referred to as a short-circuited coaxial line). The coaxial short stub is used to add a shunt reactor to perform impedance adjustment and matching on two triple-mode resonant cavities. In addition, the coaxial short stub may be connected to a metal wall connection of a body and used as a supporting point to support the coaxial line, and use of a dielectric to support a central conductor of the coaxial line is avoided. When two cavities or multiple cavities are connected, a coaxial short stub is introduced to implement impedance matching, and such design is simple and effective. For example, in design of a single-cavity filter, impedance of both two ports is designed to be 50 ohms, but when the two ports are connected to the duplexer, an input end is divided into two parts, which are connected two groups of filter ports whose impedance is originally 50 ohm, and a filter in each group generates a reactance load for a filter in another group. A purpose of the coaxial short stub is to cancel this additional reactance load. The reactance may cancel a reactance value of the load reactance by selecting a length of the coaxial connecting bar (coaxial line). The coaxial short stub may be grounded to generate reactance to cancel impact of the load reactance. Using a method of adding a short-circuited stub, matching between two cavities and between a feeder and the cavities is implemented. In addition, the short-circuited coaxial short stub is connected to a metal wall and may be used as a supporting point to support the coaxial line, and use of a dielectric to support a central conductor of the coaxial line is avoided.

This embodiment of the present disclosure further provides a communications system. The communications system includes the duplexer.

Embodiment 3

This embodiment is different from Embodiment 1 in which there may be only one cavity in a duplexer. In this embodiment, two cavities are disposed, and a dielectric resonator is disposed in each cavity, where an input port is connected to one cavity, an output port is disposed on the other cavity, the cavities are connected using a coaxial connecting bar, end parts that are of the coaxial connecting bar and that stretch into the cavities are each connected to a coupling plate disposed opposite to the dielectric resonator, and the coaxial connecting bar includes an input end and an output end that are connected to the cavities 1, and further includes a short-circuited end and/or a connecting port.

Figure 11:
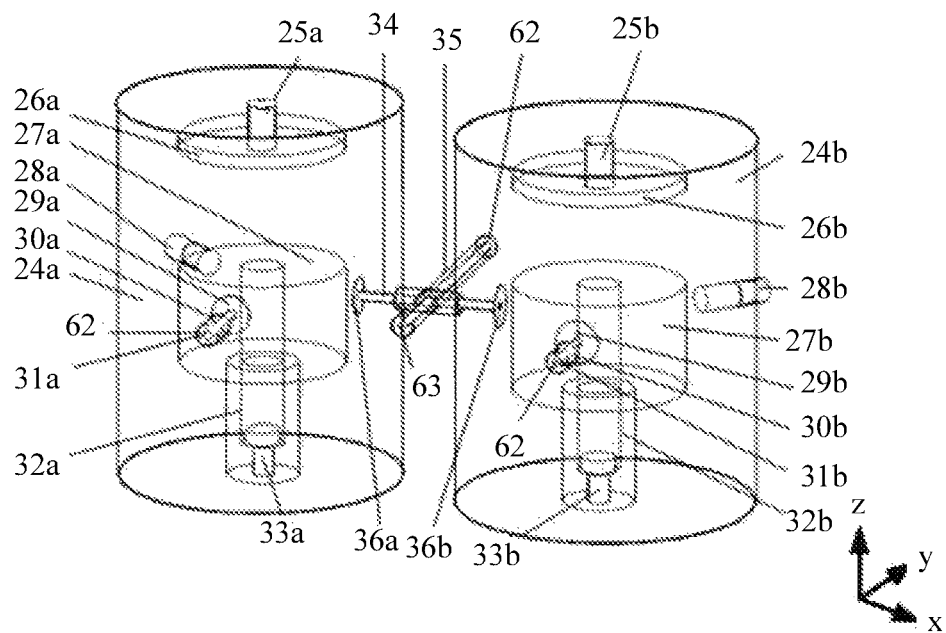
FIG. 11 is a schematic structural diagram of a duplexer according to Embodiment 3 of the present disclosure.
Figure 12:
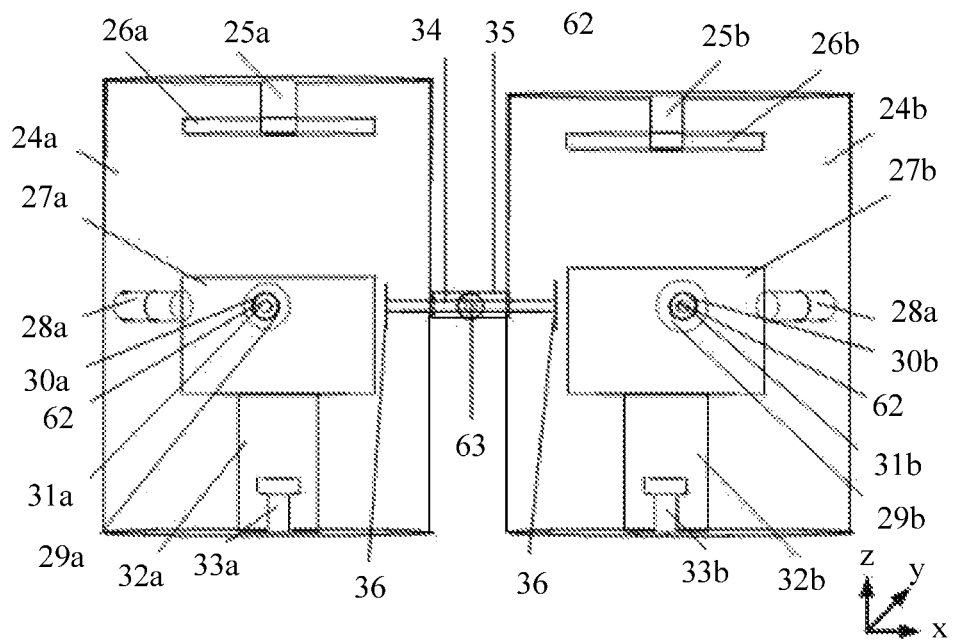
FIG. 12 is a side view of a structure of a duplexer according to Embodiment 3 of the present disclosure.
Figure 13:
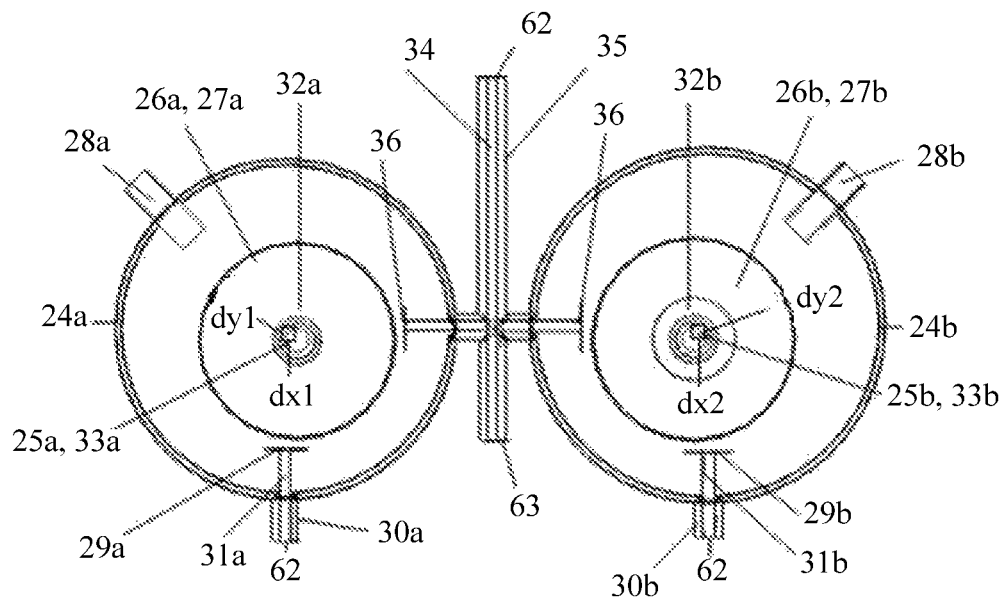
FIG. 13 is a top view of a structure of a duplexer according to Embodiment 3 of the present disclosure.
Figure 14:
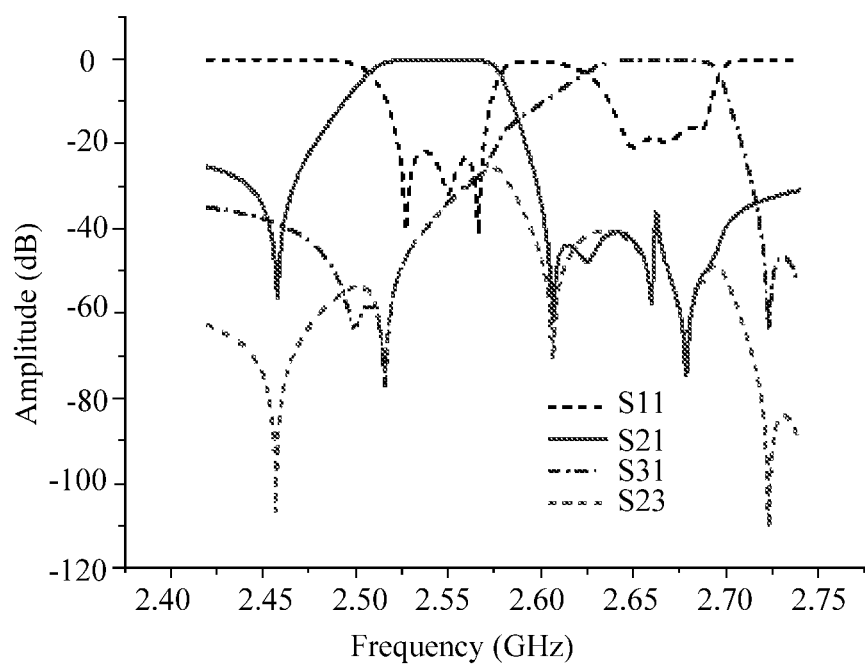
FIG. 14 is an electromagnetic simulation curve diagram of a frequency response of a duplexer according to Embodiment 3 of the present disclosure.

In this embodiment, as shown in FIG. 11 and FIG. 12, two cavities are respectively a first cavity 24*a* and a second cavity 24*b* that are disposed adjacently, and the first cavity 24*a* and the second cavity 24*b* may be located on a same body. Two dielectric resonators are disposed, and are respectively a first dielectric resonator 27*a* and a second dielectric resonator 27*b*. The first dielectric resonator 27*a* is disposed in the first cavity 24*a*, and the second dielectric resonator 27*b* is disposed in the second cavity 24*b*. An input port is connected to the first cavity 24*a*, and an output port is connected to the second cavity 24*b*, and the first cavity 24*a* and the second cavity 24*b* are connected using a coaxial connecting bar, where two ends of the coaxial connecting bar are respectively connected to a coupling plate opposite to the first dielectric resonator 27*a* and a coupling plate opposite to the second dielectric resonator 27*b*. The coupling plates may take on a circular shape.

As shown in FIG. 11 and FIG. 12, the input port on the first cavity 24*a* and the output port on the second cavity 24*b* are both perpendicular to a connecting line that connects a central axis of the first cavity 24*a* and a central axis of the second cavity 24*b*, and the input port on the first cavity 24*a* and the output port on the second cavity 24*b* are disposed in a same direction. The first dielectric resonator 27*a* in the first cavity 24*a* is shifted in a direction of the input port and the coaxial connecting bar to misalign with the central axis of the first cavity 24*a*, and the second dielectric resonator 27*b* in the second cavity 24*b* is shifted in a direction of the output port and the coaxial connecting bar to misalign with the central axis of the second cavity 24*b*. A first tuning screw 28*a* is connected to the first cavity 24*a*, and a second tuning screw 28*b* is connected to the second cavity 24*b*. The first tuning screw 28*a* points to the central axis of the first cavity 24*a*, and the second tuning screw 28*b* points to the central axis of the second cavity 24*b*.

As shown in FIG. 11 and FIG. 12, a first dielectric tuner 26*a* and a first supporting dielectric 32*a* are disposed in the first cavity 24*a*, the first dielectric tuner 26*a* is connected to the body using a screw 25*a*, and the first supporting dielectric 32*a* is connected to the body using a screw 33*a*. A second dielectric tuner 26*b* and a second supporting dielectric 32*b* are disposed in the second cavity 24*b*, the second dielectric tuner 26*b* is connected to the body using a screw 25*b*, and the second supporting dielectric 32*b* is connected to the body using a screw 33*b*.

As shown in FIG. 11 and FIG. 12, an input-end interior conductor 31*a*, an input-end exterior conductor 30*a*, and a first tuning screw 17*a* are connected to the first cavity 24*a*. An output-end interior conductor 31*b*, an output-end exterior conductor 30*b*, and a first tuning screw 17*b* are connected to the second cavity 24*b*. An input-end coupling plate 29*a* and an output-end coupling plate 29*b* are respectively connected to the input-end interior conductor 31*a* and the output-end interior conductor 31*b*.

In this embodiment, as shown in FIG. 11 to FIG. 14, the coaxial connecting bar is a cross-shaped coaxial connecting bar, where the cross-shaped coaxial connecting bar includes a short-circuited end 63, a connecting end 62, an input end connected to the first cavity 24*a*, and an output end connected to the second cavity 24*b*, and the input end and the output end are disposed in opposite directions. Two ends (input end and output end) of the cross-shaped coaxial connecting bar are used to connect to the two cavities. The input end and the output end are connected to coupling plates 36a and 36b. The other two ends are a coaxial short stub (short-circuited end) are a new port (connecting end). The cross-shaped coaxial connecting bar includes a cross-shaped coaxial connecting bar interior conductor 35 and a cross-shaped coaxial connecting bar exterior conductor 36. In this embodiment, a coordinate system is established using a center of the first cavity 24a or a center of the second cavity 24b as an origin, a vertical direction as an x direction, and a horizontal direction as a y direction. The input port faces a negative x direction, and the output port also faces the negative x direction. The first dielectric resonator 27a is shifted by dx1 in a positive x direction, and shifted by dy1 in a negative y direction, where dx1 and dy1 may be equal, or may be unequal. The second dielectric resonator 27b is shifted by dx2 in the negative x direction, and shifted by dy2 in the negative y direction, where dx2 and dy2 may be equal, or may be unequal. The input port (positive x direction) is parallel to the output port (negative x direction), an included angle between the first tuning screw 28a and the input port (negative x direction) is 135 degrees, and an included angle between the second tuning screw 28b and the output port (negative x direction) is also 135 degrees.

Figure 15:
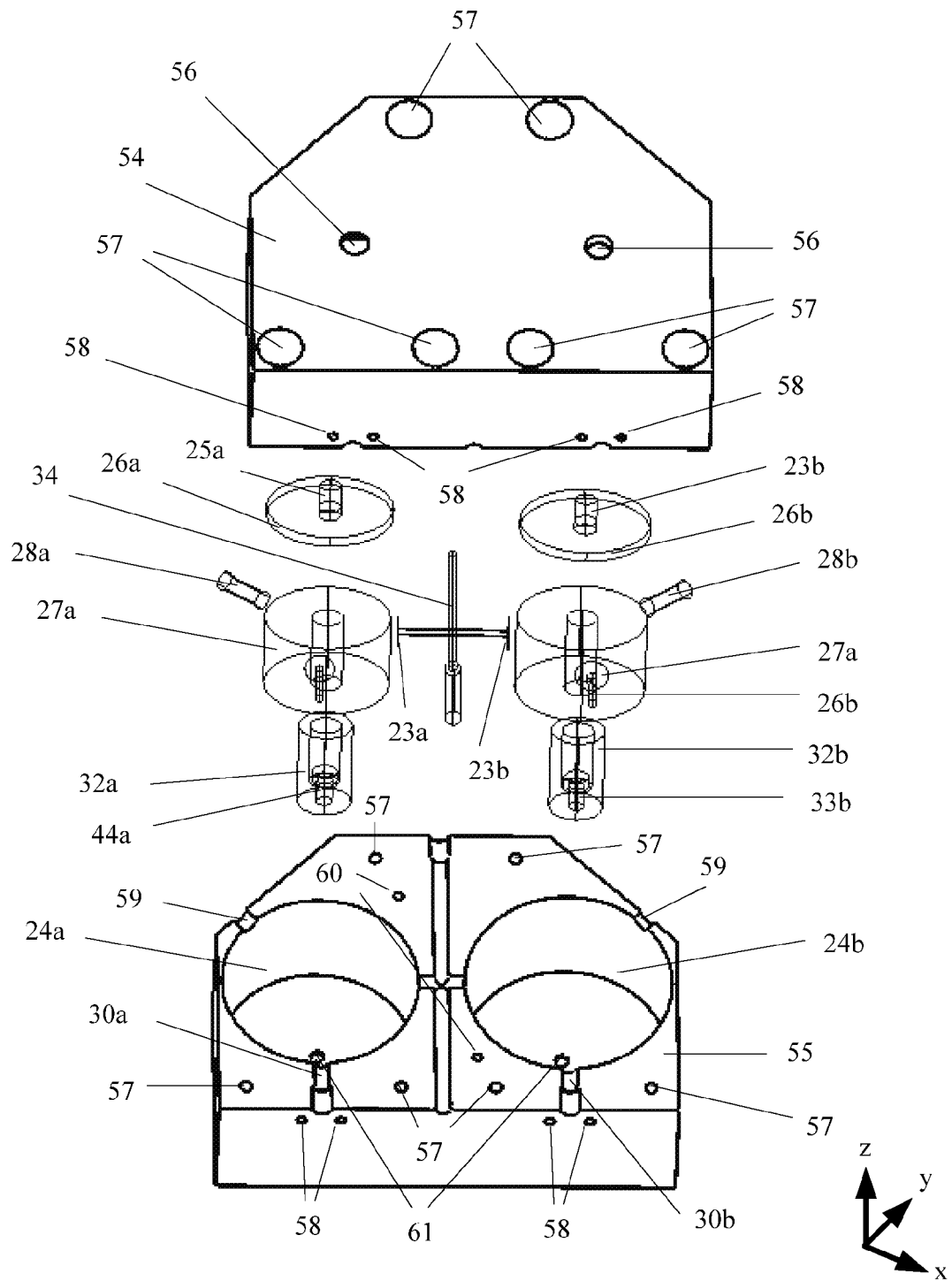
FIG. 15 is a schematic structural diagram of implementing a duplexer according to Embodiment 3 of the present disclosure.
Figure 16:
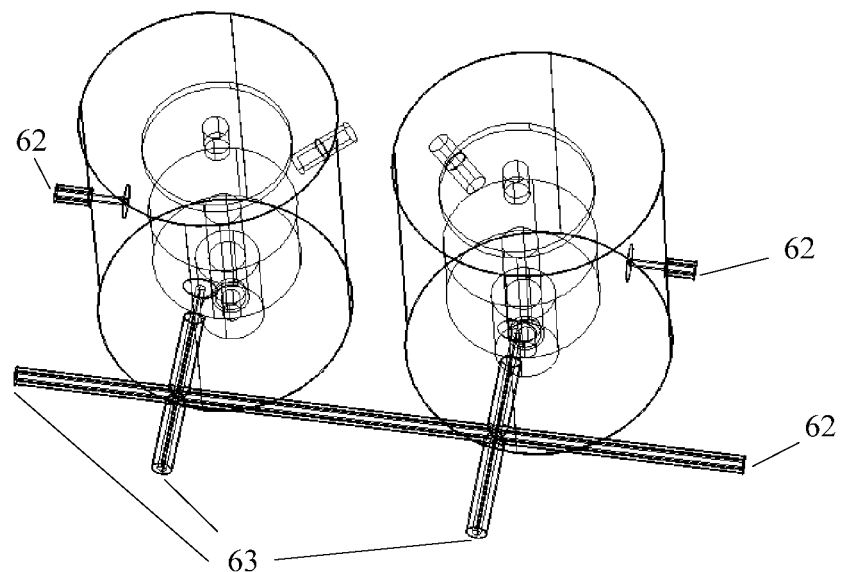
FIG. 16 is a schematic structural diagram of a duplexer according to Embodiment 3 of the present disclosure.

As shown in FIG. 11 and FIG. 15, the body includes a first body 54 and a second body 55, where the first body 54 and the second body 55 may be butted and disposed up and down, an upper half cavity is disposed at a lower end of the first body 54, and a lower half cavity is disposed at an upper end of the second body 55, and the upper half cavity and the lower half cavity are butted to form the cavity 1.

As shown in FIG. 11 and FIG. 15, pin holes 60 are disposed on the first body 54 and an end face opposite to the first body 54, and positioning pins are inserted in the pin holes 60, for precise positioning of the first body 54 and the second body 55. This is advantageous for ensuring performance of the duplexer. The first body 54 and the second body 55 are fixedly connected using a locking member. The locking member may be a screw or the like, and assembly thereof is simple and convenient. Mounting holes 57 that match the locking member are disposed on the first body 54 and the second body 55. Threaded holes 56 that match the screws 25a and 25b are disposed on the top of the first body 54, and threaded holes 61 that match the screws 33a and 33b are disposed at the bottom of the second body 55. Threaded holes 58 for fixing SMA connectors are disposed at positions that are on side faces of the first body 54 and the second body 55 and that are corresponding to the input port and the output port 62. Threaded holes 59 that match the tuning screws 17a and 17b are disposed on the end face of the first body 54 and an end face of the second body 55 that are opposite to each other. The input-end exterior conductor 30a and the output-end exterior conductor 30b may be grooves opened on the end faces of the first body 54 and the second body 55.

The duplexer provided in this embodiment of the present disclosure overcomes a problem that it is difficult to generate zeros in existing single-cavity and single-mode duplexer, and a highly-selective dielectric multi-mode filter and duplexer having transmission zeros on both sides of a passband are provided.

Figure 19:
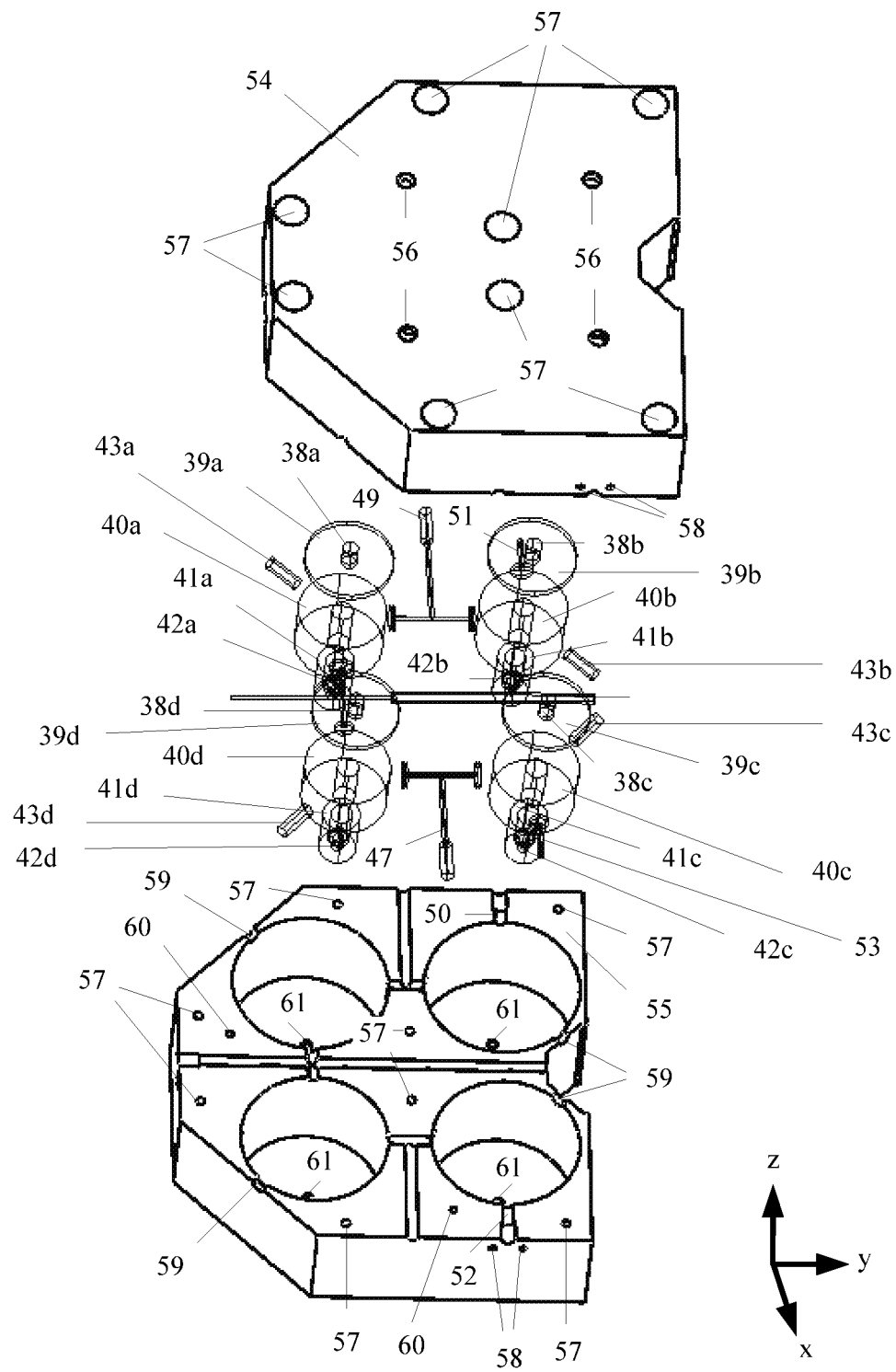
FIG. 19 is a schematic structural diagram of implementing a duplexer according to Embodiment 4 of the present disclosure.

As shown in FIG. 9, FIG. 19 is a schematic diagram of an improved structure of a double-cavity multi-mode dielectric duplexer according to Embodiment 3 of the present disclosure. A design freedom is increased by changing an original cross-shaped coaxial connecting line to two cross-shaped coaxial connecting lines that are connected in series, and changing adjustment and matching using one short stub to adjustment and matching using three short stubs, that is, two cavities are connected using two cross-shaped coaxial connecting bars that are connected in series.

This embodiment of the present disclosure further provides a communications system. The communications system includes the duplexer.

Embodiment 4

Figure 17:
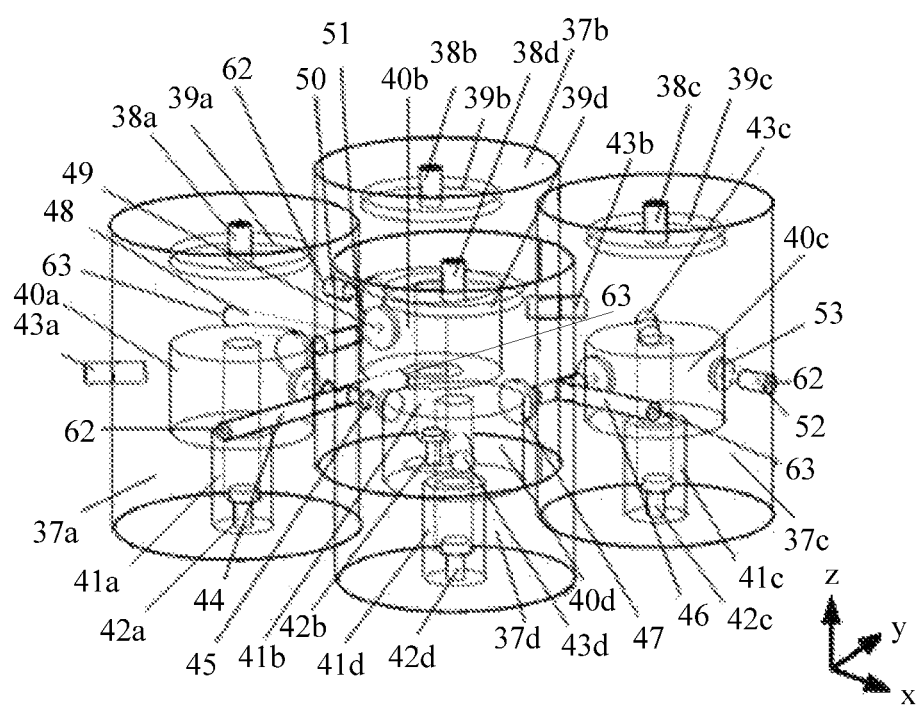
FIG. 17 is a schematic structural diagram of a duplexer according to Embodiment 4 of the present disclosure.
Figure 18:
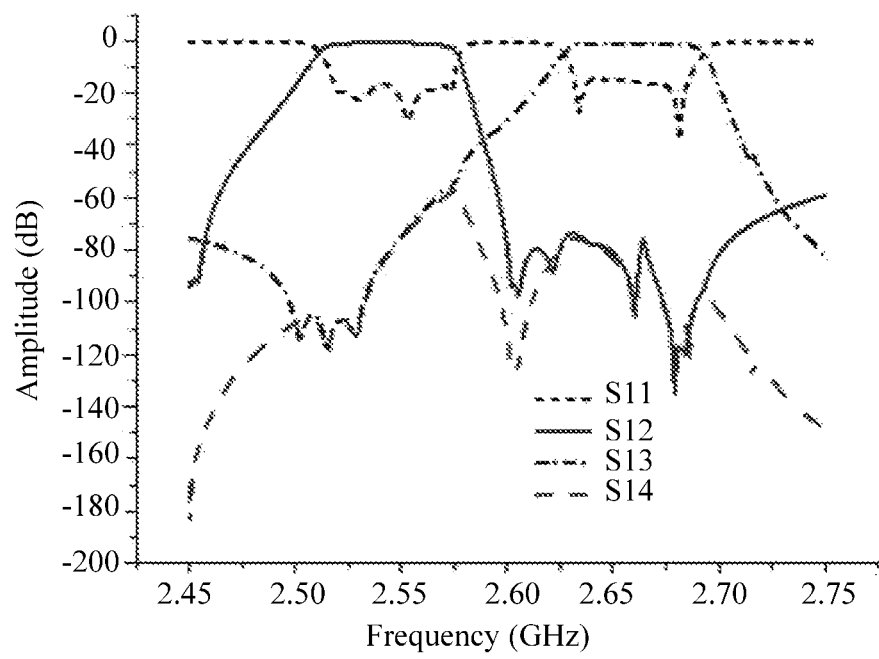
FIG. 18 is an electromagnetic simulation curve of a frequency response of a duplexer according to Embodiment 4 of the present disclosure.

This embodiment is different from Embodiment 1 in which there may be only one cavity 1 in a duplexer. In this embodiment, as shown in FIG. 17 to FIG. 19, four cavities 1 are disposed, and are respectively a first cavity 37a, a second cavity 37b, a third cavity 37c, and a fourth cavity 37d that are disposed in two rows and two columns. Four dielectric resonators are disposed, and are respectively a first dielectric resonator 40a, a second dielectric resonator 40b, a third dielectric resonator 40c, and a fourth dielectric resonator 40d, the first dielectric resonator 40a is disposed in the first cavity 37a, the second dielectric resonator 40b is disposed in the second cavity 37b, the third dielectric resonator 40c is disposed in the third cavity 37c, and the fourth dielectric resonator 40d is disposed in the fourth cavity 37d, an input port is connected to the first cavity 37a, and an output port is connected to the fourth cavity 37d, and the first cavity 37a and the second cavity 37b are connected using a first T-shaped coaxial connecting bar 49, the third cavity 37c and the fourth cavity 37d are connected using a second T-shaped coaxial connecting bar 47, and the first cavity 37a and the third cavity 37c are connected using a cross-shaped coaxial connecting bar, or the second cavity 37b and the fourth cavity 37d are connected using a cross-shaped coaxial connecting bar. A first tuning screw 43a is connected to the first cavity 37a, a second tuning screw 43b is connected to the second cavity 37b, and the first tuning screw 43a and the second tuning screw 43b point to different directions. A third tuning screw 43c is connected to the third cavity 37c, a fourth tuning screw 43d is connected to the fourth cavity 37d, and the third tuning screw 43c and the fourth tuning screw 43d point to different directions. The duplexer provided in this embodiment of the present disclosure overcomes a problem that it is difficult to generate zeros in existing single-cavity and single-mode duplexer, and a highly-selective dielectric multi-mode filter and duplexer having transmission zeros on both sides of a passband are provided.

As shown in FIG. 17 to FIG. 19, dielectric tuners 39a, 39b, 39c, and 39d, and supporting dielectrics 41a, 41b, 41c, and 41d are respectively disposed in the cavities. The dielectric tuners 39a, 39b, 39c, and 39d are respectively connected to a body using screws 38a, 38b, 38c, and 38d. The supporting dielectrics 41a, 41b, 41c, and 41d are respectively connected to the cavities using screws 42a, 42b, 42c, and 42d. In one embodiment, pin holes 60 are disposed on a first body 54 and an end face opposite to the first body 54, and positioning pins are inserted in the pin holes 60, for precise positioning of the first body 54 and a second body 55. This is advantageous for ensuring performance of the duplexer. The first body 54 and the second body 55 are fixedly connected using a locking member. The locking member may be a screw or the like, and assembly thereof is simple and convenient. Mounting holes 57 that match the locking member are disposed on the first body 54 and the second body 55. Threaded holes 56 that match the screws are disposed on the top of the first body 54, and threaded holes 61 that match the screws are disposed at the bottom of the second body 55. Threaded holes 58 for fixing SMA connectors are disposed at positions that are on side faces of the first body 54 and the second body 55 and that are corresponding to the input port and the output port 62. Threaded holes 59 that match the tuning screws are disposed on the end face of the first body 54 and an end face of the second body 55 that are opposite to each other. An input-end exterior conductor 50 and an output-end exterior conductor 52 may be grooves opened on the end faces of the first body 54 and the second body 55. A cross-shaped coaxial connecting bar includes a cross-shaped coaxial connecting bar exterior conductor 44 and a cross-shaped coaxial connecting bar interior conductor 45. One T-shaped coaxial connecting bar includes a T-shaped coaxial connecting bar exterior conductor 46, a T-shaped coaxial connecting bar interior conductor 47, and a circular coupling plate connected to the T-shaped coaxial connecting bar interior conductor 47. The other T-shaped coaxial connecting bar includes a T-shaped coaxial connecting bar exterior conductor 48, a T-shaped coaxial connecting bar interior conductor 49, and a circular coupling plate connected to the T-shaped coaxial connecting bar interior conductor 49. In the figures, a coaxial exterior conductor 50, a coaxial interior conductor 51, and a circular coupling plate connected to the coaxial interior conductor 51 are disposed at a port 2, a coaxial exterior conductor 52, a coaxial interior conductor 53, and a circular coupling plate connected to the coaxial interior conductor 53 are disposed at a port 3.

This embodiment of the present disclosure further provides a communications system. The communications system includes the duplexer.

The foregoing descriptions are merely exemplary embodiments of the present disclosure, but are not intended to limit the present disclosure. Any modification, equivalent replacement, improvement, or the like made without departing from the spirit and principle of the present disclosure shall fall within the protection scope of the present disclosure.

What is claimed is:

1. A duplexer, comprising:
a body; and
a tuning screw connected to the body,
wherein an input port, an output port, and a cavity are disposed on the body,
wherein a dielectric resonator is disposed in the cavity,
wherein the input port is connected to an input-end coupling plate disposed opposite to the dielectric resonator,
wherein the output port is connected to an output-end coupling plate disposed opposite to the dielectric resonator,
wherein a central axis of the dielectric resonator misaligns with a central axis of the cavity, and
wherein the dielectric resonator is disposed and shifted toward a position of at least one of the input port and the output port relative to the central axis of the cavity.

2. The duplexer according to claim 1, wherein a dielectric tuner is further disposed in the cavity, and wherein the dielectric tuner is located over the dielectric resonator and is connected to the body using a first connecting member.

3. The duplexer according to claim 2, wherein a central axis of the dielectric tuner coincides with the central axis of the dielectric resonator.

4. The duplexer according to claim 1, wherein a supporting dielectric is further disposed in the cavity, and wherein the supporting dielectric is located under the dielectric resonator and is connected to the body using a second connecting member.

5. The duplexer according to claim 4, wherein a central axis of the supporting dielectric coincides with the central axis of the dielectric resonator.

6. The duplexer according to claim 1, wherein the input port comprises:
an input-end interior conductor; and
an input-end exterior conductor,
wherein the input-end interior conductor is covered by the input-end exterior conductor with a spacing,
wherein the output port comprises:
an output-end interior conductor; and
an output-end exterior conductor,
wherein the output-end interior conductor is covered by the output-end exterior conductor with a spacing,
wherein the input-end coupling plate is connected to the input-end interior conductor, and
wherein the output-end coupling plate is connected to the output-end interior conductor.

7. The duplexer according to claim 6, wherein the input-end exterior conductor and the output-end exterior conductor are both formed on the body in an integrated manner.

8. The duplexer according to claim 1, wherein a cross-section of the cavity takes on a circular or rectangular shape, and wherein a cross-section of the dielectric resonator takes on a circular or rectangular shape.

9. The duplexer according to claim 1, wherein the body comprises:
a first body; and
a second body,
wherein the first body and the second body are butted and disposed up and down,
wherein an upper half cavity is disposed at a lower end of the first body, and
wherein a lower half cavity is disposed at an upper end of the second body.

10. The duplexer according to claim 9, wherein pin holes are disposed on the first body and an end face opposite to the first body, wherein positioning pins are inserted in the pin holes, and wherein the first body and the second body are fixedly connected using a locking member.

11. The duplexer according to claim 1, wherein at least two cavities are disposed, wherein the dielectric resonator is disposed in each cavity, wherein the input port is connected to at least one of the two cavities, wherein the output port is disposed on the other of the two cavities, wherein the at least two cavities are connected using a coaxial connecting bar, wherein end parts that are of the coaxial connecting bar and that stretch into the cavities are each connected to a coupling plate disposed opposite to the dielectric resonator, and wherein the coaxial connecting bar comprises:
an input end;
an output end;
a short-circuited end; and
a connecting port,
wherein the input end and the output end are connected to the at least two cavities.

12. The duplexer according to claim 11, wherein the coaxial connecting bar is at least one of a T-shaped coaxial connecting bar and a cross-shaped coaxial connecting bar.

13. The duplexer according to claim 12, wherein two adjacent cavities are connected using two cross-shaped coaxial connecting bars, or connected using two T-shaped coaxial connecting bars, or connected using one T-shaped coaxial connecting bar and one cross-shaped coaxial connecting bar.

14. The duplexer according to claim 1, wherein two cavities are disposed, wherein the two cavities are respectively a first cavity and a second cavity that are disposed adjacently, wherein two dielectric resonators are disposed, wherein the two dielectric resonators are respectively a first dielectric resonator and a second dielectric resonator, wherein the first dielectric resonator is disposed in the first cavity, wherein the second dielectric resonator is disposed in the second cavity, wherein the input port is connected to the first cavity, wherein the output port is connected to the second cavity, wherein the first cavity and the second cavity are connected using a coaxial connecting bar, and wherein two ends of the coaxial connecting bar are respectively connected to a coupling plate opposite to the first dielectric resonator and a coupling plate opposite to the second dielectric resonator.

15. The duplexer according to claim 14, wherein: the input port on the first cavity and the output port on the second cavity are both perpendicular to a connecting line that connects a central axis of the first cavity and a central axis of the second cavity, wherein the input port on the first cavity and the output port on the second cavity are disposed in opposite directions, wherein the first dielectric resonator in the first cavity is shifted in a direction of the input port and the coaxial connecting bar to misalign with the central axis of the first cavity, and wherein the second dielectric resonator in the second cavity is shifted in a direction of the output port and the coaxial connecting bar to misalign with the central axis of the second cavity.

16. The duplexer according to claim 15, wherein the coaxial connecting bar is a T-shaped coaxial connecting bar, wherein the T-shaped coaxial connecting bar comprises:
   a short-circuited end;
   an input end connected to the first cavity; and
   an output end connected to the second cavity, and wherein the input end and the output end are disposed in opposite directions.

17. The duplexer according to claim 15, wherein the coaxial connecting bar is a cross-shaped coaxial connecting bar, wherein the cross-shaped coaxial connecting bar comprises:
   a short-circuited end;
   a connecting end;
   an input end connected to the first cavity; and
   an output end connected to the second cavity, wherein the input end and the output end are disposed in opposite directions.

18. The duplexer according to claim 1, wherein four cavities are disposed, wherein the four cavities are respectively a first cavity, a second cavity, a third cavity, and a fourth cavity that are disposed in two rows and two columns, wherein four dielectric resonators are disposed, wherein the four dielectric resonators are respectively a first dielectric resonator, a second dielectric resonator, a third dielectric resonator, and a fourth dielectric resonator, wherein the first dielectric resonator is disposed in the first cavity, wherein the second dielectric resonator is disposed in the second cavity, wherein the third dielectric resonator is disposed in the third cavity, wherein the fourth dielectric resonator is disposed in the fourth cavity, wherein the input port is connected to the first cavity, wherein the output port is connected to the fourth cavity, wherein the first cavity and the second cavity are connected using a first T-shaped coaxial connecting bar, wherein the third cavity and the fourth cavity are connected using a second T-shaped coaxial connecting bar, wherein the first cavity and the third cavity are connected using a cross-shaped coaxial connecting bar, or the second cavity and the fourth cavity are connected using a cross-shaped coaxial connecting bar.

19. A communications system, comprising:
   a duplexer comprising:
      a body; and
      a tuning screw,
      wherein an input port, an output port, and a cavity are disposed on the body,
      wherein a dielectric resonator is disposed in the cavity,
      wherein the input port is connected to an input-end coupling plate disposed opposite to the dielectric resonator,
      wherein the output port is connected to an output-end coupling plate disposed opposite to the dielectric resonator,
   wherein a central axis of the dielectric resonator misaligns with a central axis of the cavity,
   wherein a supporting dielectric is further disposed in the cavity, and
   wherein the supporting dielectric is located under the dielectric resonator and is connected to the body using a second connecting member.

* * * * *